(12) United States Patent
Cantoro et al.

(10) Patent No.: US 10,276,564 B2
(45) Date of Patent: Apr. 30, 2019

(54) SEMICONDUCTOR DEVICE INCLUDING VERTICAL CHANNEL

(71) Applicant: Samsung Electronics Co., Ltd., Suwon-si, Gyeonggi-do (KR)

(72) Inventors: Mirco Cantoro, Suwon-si (KR); Yeon Cheol Heo, Suwon-si (KR); Byoung Gi Kim, Suwon-si (KR); Chang Min Yoe, Seoul (KR); Seung Chan Yun, Suwon-si (KR); Dong Hun Lee, Anyang-si (KR); Yun Il Lee, Anyang-si (KR); Hyung Suk Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 13 days.

(21) Appl. No.: 15/489,093

(22) Filed: Apr. 17, 2017

(65) Prior Publication Data

US 2018/0151561 A1 May 31, 2018

(30) Foreign Application Priority Data

Nov. 28, 2016 (KR) ........................ 10-2016-0159664

(51) Int. Cl.
*H01L 27/088* (2006.01)
*H01L 29/786* (2006.01)
(Continued)

(52) U.S. Cl.
CPC ............ *H01L 27/088* (2013.01); *B82Y 10/00* (2013.01); *H01L 21/823412* (2013.01); *H01L 21/823487* (2013.01); *H01L 23/50* (2013.01); *H01L 29/0676* (2013.01); *H01L 29/401* (2013.01); *H01L 29/42392* (2013.01); *H01L 29/66439* (2013.01); *H01L 29/66469* (2013.01); *H01L 29/775* (2013.01); *H01L 29/78642* (2013.01); *H01L 29/78696* (2013.01); *H01L 21/823456* (2013.01); *H01L 2029/42388* (2013.01)

(58) Field of Classification Search
CPC ............ H01L 29/7855; H01L 29/7856; H01L 29/78642; H01L 29/0676; H01L 27/0886
See application file for complete search history.

(56) References Cited

U.S. PATENT DOCUMENTS 9,219,064 B2* 12/2015 Kim ...................... H01L 27/092
9,252,145 B2   2/2016 Basker et al.
(Continued)

FOREIGN PATENT DOCUMENTS

JP            4429798 B2      3/2010

*Primary Examiner* — Allison Bernstein
(74) *Attorney, Agent, or Firm* — Harness, Dickey & Pierce, P.L.C.

(57) ABSTRACT

A semiconductor device includes a substrate having a first region and a second region; a first nanowire in the first region in a direction perpendicular to an upper surface of the substrate; a second nanowire in the second region in a direction perpendicular to the upper surface of the substrate and having a height less than that of the first nanowire; first source/drain regions at top portion and bottom portion of the first nanowire; second source/drain regions at top portion and bottom portion of the second nanowire; a first gate electrode surrounding the first nanowire between the first source/drain regions; and a second gate electrode surrounding the second nanowire between the second source/drain regions.

18 Claims, 14 Drawing Sheets

(51) Int. Cl.
*H01L 29/06* (2006.01)
*H01L 23/50* (2006.01)
*H01L 21/8234* (2006.01)
*H01L 29/423* (2006.01)
*B82Y 10/00* (2011.01)
*H01L 29/40* (2006.01)
*H01L 29/66* (2006.01)
*H01L 29/775* (2006.01)

(56) References Cited

U.S. PATENT DOCUMENTS

| | | |
|---|---|---|
| 9,368,388 B2 | 6/2016 | Liaw |
| 9,368,569 B1 | 6/2016 | Leobandung et al. |
| 9,385,023 B1 | 7/2016 | Cheng et al. |
| 9,698,145 B1 * | 7/2017 | Balakrishnan ............................... H01L 21/823481 |
| 10,014,409 B1 * | 7/2018 | Wu .................... H01L 29/7827 |
| 2014/0225168 A1 | 8/2014 | Pham et al. |
| 2015/0228722 A1 | 8/2015 | Chung et al. |
| 2016/0104705 A1 | 4/2016 | Chung et al. |
| 2016/0111420 A1 | 4/2016 | Zhang et al. |
| 2016/0211138 A1 | 7/2016 | Huang et al. |
| 2018/0005896 A1 * | 1/2018 | Mallela ........... H01L 21/823456 |
| 2018/0006025 A1 * | 1/2018 | Hook .................... H01L 27/088 |

* cited by examiner

SEMICONDUCTOR DEVICE INCLUDING VERTICAL CHANNEL

CROSS-REFERENCE TO RELATED APPLICATION

This application claims priority to Korean Patent Application No. 10-2016-0159664 filed on Nov. 28, 2016 in the Korean Intellectual Property Office, the disclosure of which is incorporated herein by reference in its entirety.

BACKGROUND

1. Field

Some example embodiments of the present inventive concepts relate to a semiconductor device including a vertical channel.

2. Description of Related Art

As a scaling technique for increasing the density of semiconductor devices, multigate field-effect transistors having an active pattern formed as a fin or a nanowire capable of suppressing a short channel effect have been proposed.

SUMMARY

Example embodiments of the present inventive concepts may provide a semiconductor device in which a reliability problem including a hot carrier effect of a transistor in an input/output (I/O) circuit region is solved and which has improved performance in such a manner that heights of nanowires in transistors of a logic circuit region and of an I/O circuit region are formed to be different.

According to example embodiments of the present inventive concepts, a semiconductor device includes a substrate having a first region and a second region; a first nanowire in the first region in a direction perpendicular to an upper surface of the substrate; a second nanowire in the second region in a direction perpendicular to the upper surface of the substrate and having a height lower than that of the first nanowire; first source/drain regions at top portion and bottom portion of the first nanowire; second source/drain regions at top portion and bottom portion of the second nanowire; a first gate electrode surrounding the first nanowire between the first source/drain regions; and a second gate electrode surrounding the second nanowire between the second source/drain regions.

According to example embodiments of the present inventive concepts, a semiconductor device includes a substrate, a first vertical field-effect transistor including a first nanowire on the substrate and providing a first vertical channel region, a first gate electrode surrounding the first vertical channel region, and a first gate dielectric layer between the first nanowire and the first gate electrode, and a second vertical field-effect transistor including a second nanowire on the substrate and providing a second vertical channel region, a second gate electrode surrounding the second nanowire, and a second gate dielectric layer between the second nanowire and the second gate electrode. A height of the first nanowire is greater than that of the second nanowire.

According to example embodiments of the present inventive concepts, a structure includes a substrate including a first region and a second region, at least one first nanowire in the first region in a direction perpendicular to an upper surface of the substrate, at least one second nanowire in the second region in the direction perpendicular to the upper surface of the substrate, and an upper end of the second nanowire is closer to the upper surface of the substrate than a upper end of the first nanowire.

BRIEF DESCRIPTION OF DRAWINGS

The above and other aspects, features and other advantages of the present inventive concepts will be more clearly understood from the following detailed description when taken in conjunction with the accompanying drawings, in which.

DETAILED DESCRIPTION

Hereinafter, example embodiments of the present inventive concepts will be described with reference to the attached drawings.

Figure 1:
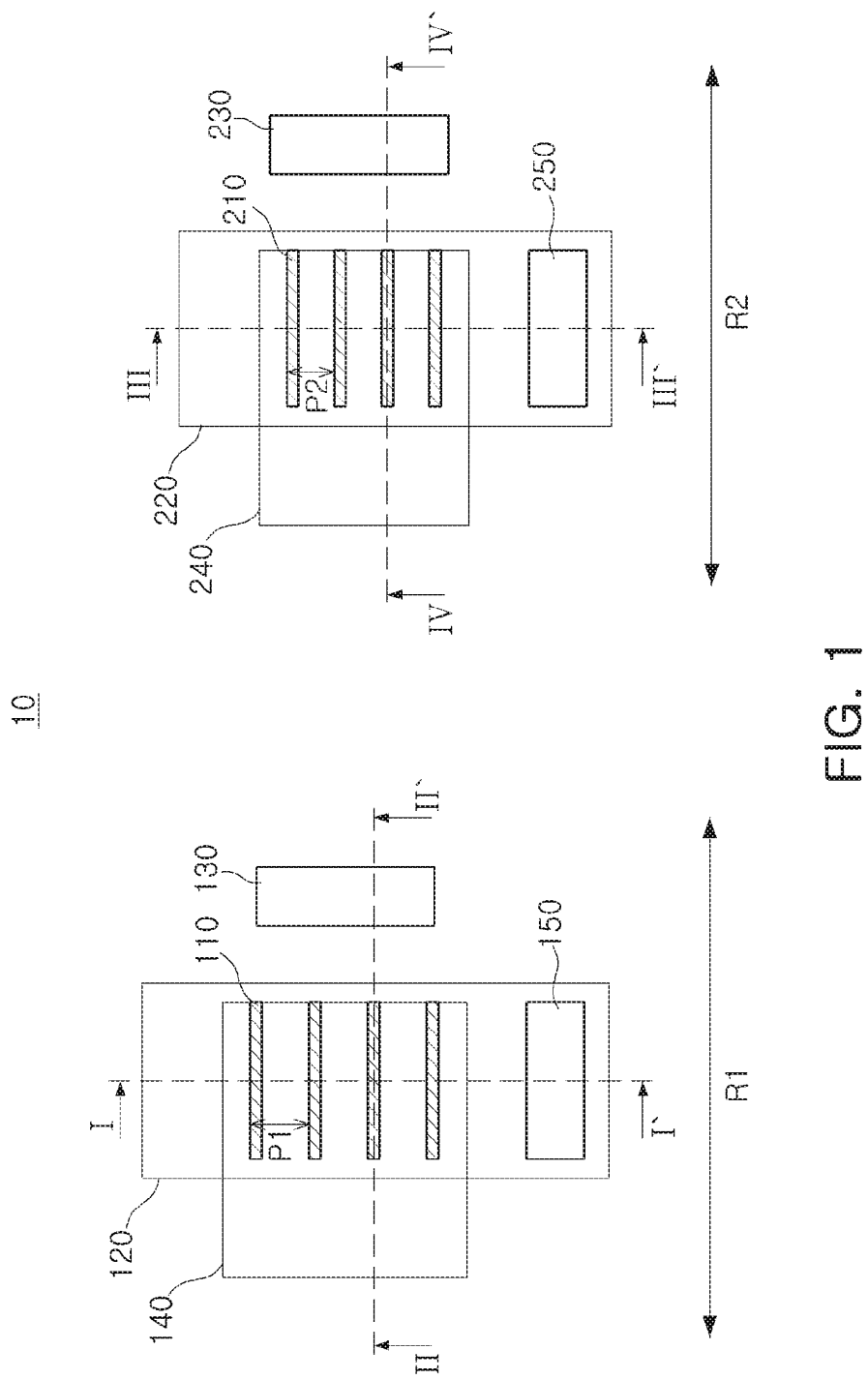
FIG. 1 is a layout of a semiconductor device according to example embodiments of the present inventive concepts.
Figure 2:
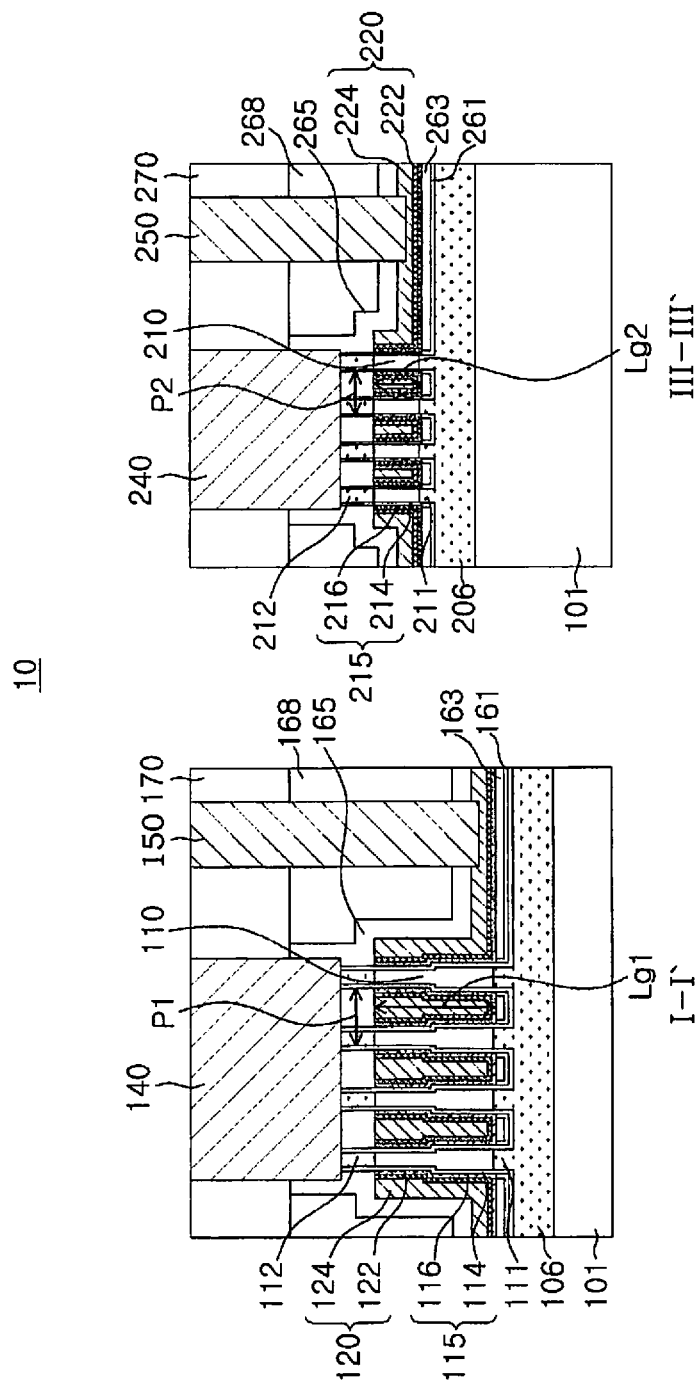
FIG. 2 is cross-sectional views taken along lines I-I' and III-III' of the semiconductor device illustrated in FIG. 1.
Figure 3:
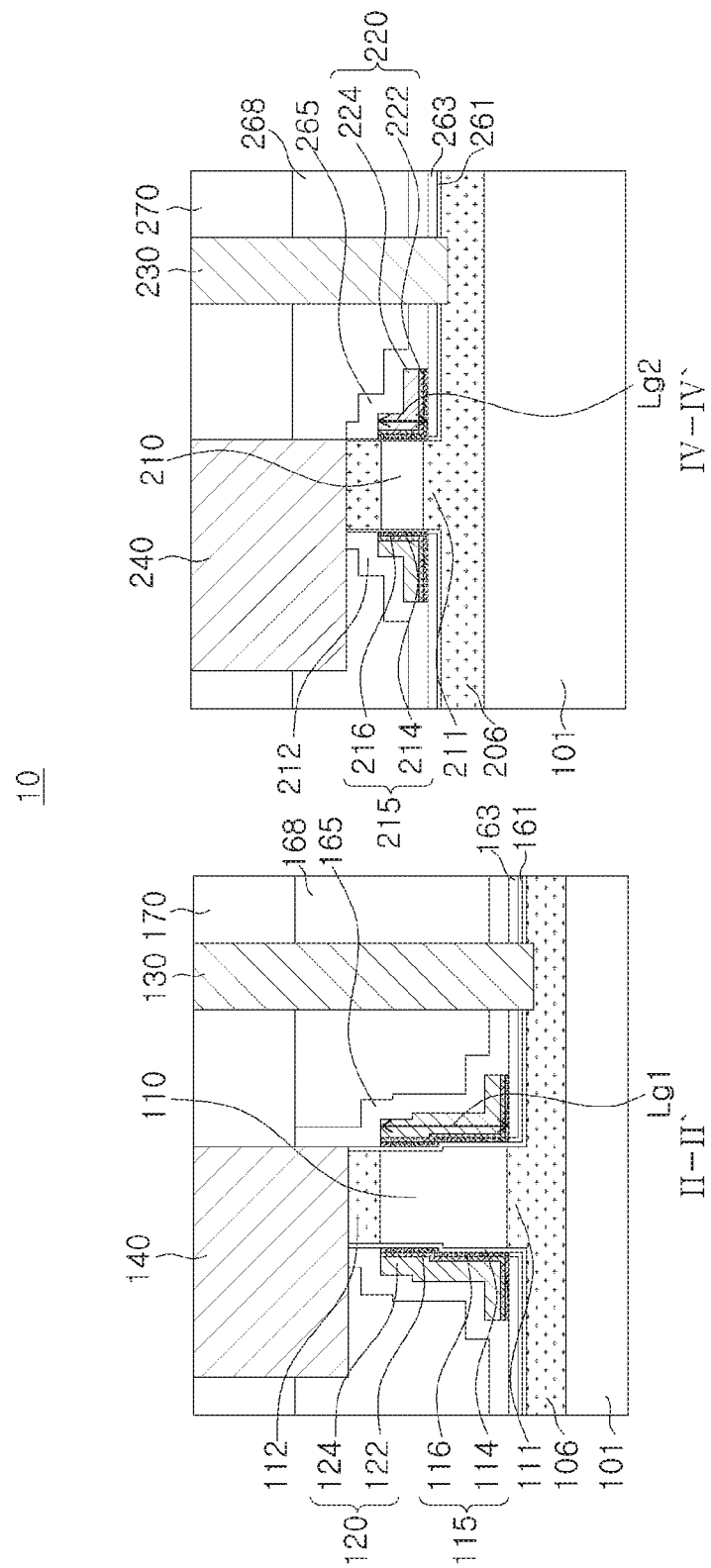
FIG. 3 is cross-sectional views taken along lines II-II' and IV-IV' of the semiconductor device illustrated in FIG. 1.

FIG. 1 is a layout of a semiconductor device 10 according to example embodiments of the present inventive concepts. FIG. 2 is cross-sectional views taken along lines I-I' and III-III' of the semiconductor device illustrated in FIG. 1. FIG. 3 is cross-sectional views taken along lines II-II' and IV-IV' of the semiconductor device illustrated in FIG. 1.

With reference to FIGS. 1 to 3, the semiconductor device 10 may include a first vertical field-effect transistor formed in a first region R1 of a substrate 101 and a second vertical field-effect transistor formed in a second region R2 of the substrate 101. The first vertical field-effect transistor and the second vertical field-effect transistor may be provided as vertical gate-all-around (GAA) field-effect transistors.

The substrate 101 may include a semiconductor material, may at least partially comprise a Group IV semiconductor, a Group III-V compound semiconductor, or a Group II-VI compound semiconductor. The substrate 101 may include the first region R1 and the second region R2. The first region R1 may be provided as an input/output (I/O) circuit region, while the second region R2 may be provided as a logic circuit region.

The first vertical field-effect transistor may include first nanowires 110 disposed in a direction perpendicular to an upper surface of the substrate 101 and providing first vertical channel regions, first lower source/drain regions 111 and first upper source/drain regions 112 disposed at top portion and bottom portion of the first nanowires 110, and a first gate electrode 120 surrounding the first nanowires 110 between the first lower source/drain regions 111 and the first upper source/drain regions 112. In other words, the first gate electrode 120 may be disposed around the first nanowires 110, in order to surround the first vertical channel regions. The first nanowires 110 may include an upper region and a lower region having different widths. The lower region of the first nanowires 110 may be wider than the upper region thereof. The first nanowires 110 may have a sheet form in which a width in one direction is different from that in the other direction. Alternatively, the first nanowires 110 may have a cylindrical form or a form of a faceted cylinder. The first nanowires 110 may include a semiconductor material, may at least partially comprise a Group IV semiconductor, a Group III-V compound semiconductor, or a Group II-VI compound semiconductor. A first gate dielectric layer 115 may be interposed between the first gate electrode 120 and the first nanowires 110, while the first gate dielectric layer 115 may include a first dielectric layer 114 and a high-k dielectric layer 116. The first gate electrode 120 may be extended along the upper surface of the substrate 101 in a horizontal direction. The first gate electrode 120 may comprise a first conductive layer 122 including a metallic nitride, may at least partially comprise titanium nitride (TiN), tantalum nitride (TaN), etc., and comprise a second conductive layer 124 including a metal, may at least partially comprise tungsten (W), cobalt (Co), copper (Cu), aluminum (Al), etc. The first lower source/drain regions 111 disposed below the first nanowires 110 may be connected by a first impurity region 106 formed in the substrate 101.

The second vertical field-effect transistor may include second nanowires 210 disposed in a direction perpendicular to the upper surface of the substrate 101 and providing a second vertical channel region, second lower source/drain regions 211 and second upper source/drain regions 212 disposed at top portion and bottom portion of the second nanowires 210, and a second gate electrode 220 surrounding the second nanowires 210 between the second lower source/drain regions 211 and the second upper source/drain regions 212. In other words, the second gate electrode 220 may be disposed around the second nanowires 210, in order to surround the second vertical channel region. The second nanowires 210 may have a sheet form in which a width in one direction is different from that in the other direction. Alternatively, the second nanowires 210 may have a cylindrical form or a form of a faceted cylinder. The first nanowires 110 may include a semiconductor material, may at least partially comprise a Group IV semiconductor, a Group III-V compound semiconductor, or a Group II-VI compound semiconductor. A second gate dielectric layer 215 may be interposed between the second gate electrode 220 and the second nanowires 210, while the second gate dielectric layer 215 may include a second dielectric layer 214 and a high-k dielectric layer 216. The second gate electrode 220 may be extended along the upper surface of the substrate 101 in a horizontal direction. The second gate electrode 220 may comprise a first conductive layer 222 including a metallic nitride, may at least partially comprise TiN, TaN, etc., and comprise a second conductive layer 224 including a metal, may at least partially comprise W, Co, Cu, Al, etc. The second lower source/drain regions 211 disposed below the second nanowires 210 may be connected by a second impurity region 206 formed in the substrate 101.

A height of the first nanowires 110 may be greater than that of the second nanowires 210. An upper end of the second nanowire 210 is closer to the upper surface of the substrate 101 than a upper end of the first nanowire 110. In other words, the upper surface of the substrate 101, disposed adjacent to the first nanowires 110, may be disposed to be lower than that of the substrate 101, disposed adjacent to the second nanowires 210, as the substrate 101 of the first region R1 is etched, to form the first nanowires 110, more than the substrate 101 of the second region R2, as described with reference to FIG. 8.

A gate length Lg1 of the first gate electrode 120 in a vertical direction may be greater than a gate length Lg2 of the second gate electrode 220 in a vertical direction. A difference in heights between the upper surface of the substrate 101, disposed adjacent to the first nanowires 110 and that of the substrate 101, disposed adjacent to the second nanowires 210, may correspond to a difference in gate length between the first gate electrode 120 and the second gate electrode 220. The gate length Lg1 of the first gate electrode 120 may be greater than the gate length Lg2 of the second gate electrode 220 by a length corresponding to the difference in heights between the first nanowires 110 and the second nanowires 210.

The first gate dielectric layer 115 may be thicker than the second gate dielectric layer 215. For example, the first dielectric layer 114 forming the first gate dielectric layer 115 may be thicker than the second dielectric layer 214 forming the second gate dielectric layer 215. The high-k dielectric layer 116 and the high-k dielectric layer 216 may have the same thickness. The high-k dielectric layer 116 and the high-k dielectric layer 216 may include a high-k dielectric having a dielectric constant higher than that of a silicon oxide. In terms of the high-k dielectric, for example, a high dielectric constant insulating layer 136a may include at least one material selected from among hafnium oxide (HfOx), hafnium silicate (HfSiOx), hafnium oxynitride (HfON), hafnium silicon oxynitride (HfSiON), lanthanum oxide (LaOx), lanthanum oxynitride (LaON), lanthanum aluminum oxide (LaAlOx), zirconium oxide (ZrOx), zirconium silicate (ZrSiOx), zirconium oxynitride (ZrON), zirconium silicon oxynitride (ZrSiON), tantalum oxide (TaOx), titanium oxide (TiOx), titanium oxynitride (TiON), barium strontium titanium oxide (BaSrTiOx), barium titanium oxide (BaTiOx), strontium titanium oxide (SrTiOx), yttrium oxide (YOx), aluminum oxide (AlOx), and lead scandium tantalum oxide (PbScTaOx).

The first upper source/drain regions 112 and the second upper source/drain regions 212 may be provided as regions formed in such a manner that an impurity is injected into top portions of the first nanowires 110 and the second nanowires 210 using an ion implantation process. Alternatively, the first upper source/drain regions 112 and the second upper source/drain regions 212 may be provided as an epitaxial layer doped with an impurity, grown from the first nanowires 110 and the second nanowires 210.

A contact plug 140 may be connected to the first upper source/drain regions 112, while a contact plug 240 may be connected to the second upper source/drain regions 212. A contact plug 150 may be connected to the first gate electrode 120, while a contact plug 250 may be connected to the second gate electrode 220. A contact plug 130 may be connected to the first impurity region 106 of the substrate 101, while a contact plug 230 may be connected to the second impurity region 206 of the substrate 101.

Figure 4:
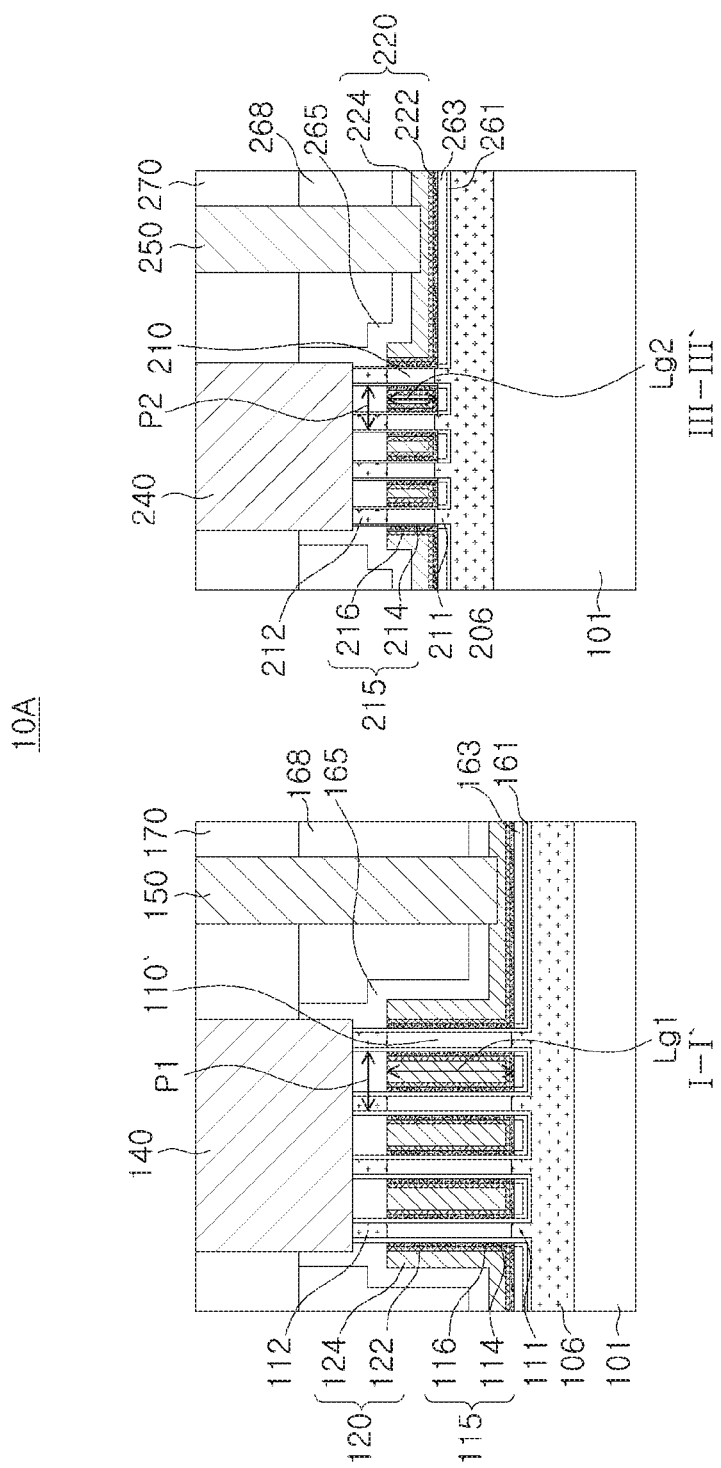
FIGS. 4 and 5 are cross-sectional views of a semiconductor device according to example embodiments.
Figure 5:
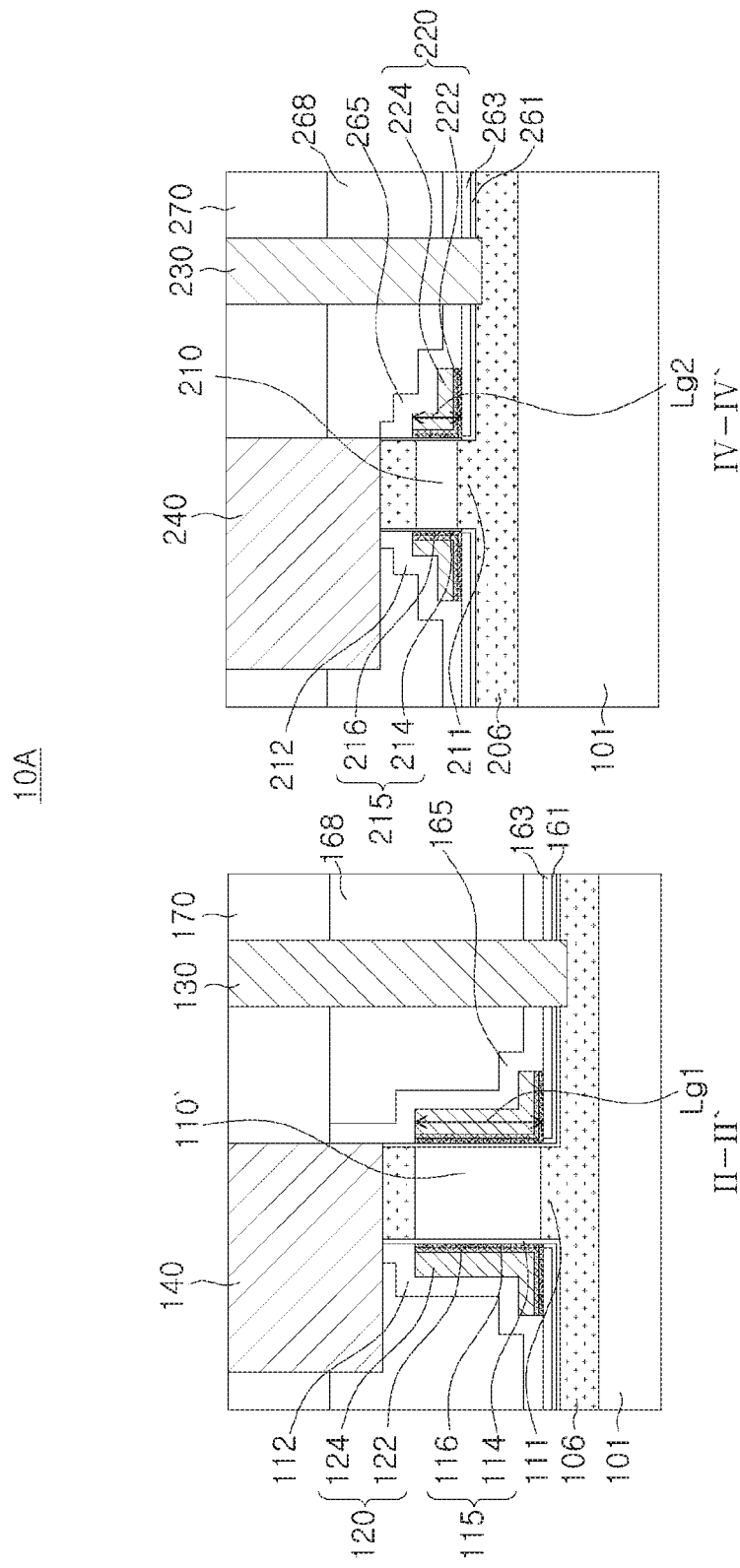

FIGS. 4 and 5 are cross-sectional views of a semiconductor device 10A according to example embodiments.

Compared with the semiconductor device 10 illustrated in FIGS. 2 and 3, the semiconductor device 10A has the same components, except for first nanowires 110' having a different form.

The first nanowires 110' may not include a portion of which a width is dramatically changed, while a width of an upper region thereof may be substantially equal to that of a lower region.

In a case in which a thickness of a first oxide layer 113 and a second oxidation process are properly selected from processes described with reference to FIGS. 7 to 9, the first nanowires 110' illustrated in FIGS. 4 and 5 may be formed.

FIGS. 6 to 13 are cross-sectional views illustrating a method of manufacturing a semiconductor device according to example embodiments. A method of manufacturing a semiconductor device, described with reference to FIGS. 6 to 13, is an example.

Figure 6:
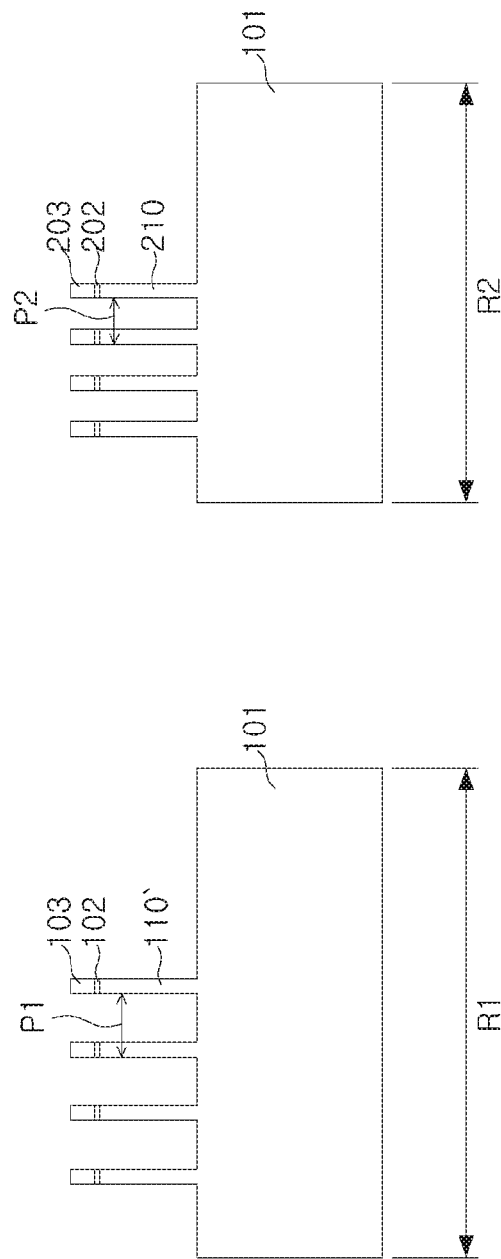
FIGS. 6 to 13 are cross-sectional views illustrating a method of manufacturing a semiconductor device according to example embodiments.

With reference to FIG. 6, first preliminary nanowires 110' and second nanowires 210 may be formed on a substrate 101 including a first region R1 and a second region R2.

First preliminary nanowires 110' may be formed on the substrate 101 of the first region R1, while second nanowires 210 may be formed on the substrate 101 of the second region R2. A pitch P1 of the first preliminary nanowires 110' may be greater than a pitch P2 of the second nanowires 210. For example, the pitch P1 of the first preliminary nanowires 110' may be less than or equal to 40 nm, while the pitch P2 of the second nanowires 210 may be less than or equal to 30 nm. A width of the first preliminary nanowires 110' may be substantially equal to that of the second nanowires 210. For example, the width of the first preliminary nanowires 110' and the width of the second nanowires 210 may be less than or equal to 10 nm.

The first preliminary nanowires 110' may be formed in such a manner that the substrate 101 is anisotropically etched using a double patterning technology (DPT). The second nanowires 210 may be formed in such a manner that the substrate 101 is anisotropically etched using a quadruple patterning technology (QPT). A hard mask layer 103 may remain above the first preliminary nanowires 110'. A buffer layer 102 may be interposed between the first preliminary nanowires 110' and the hard mask layer 103. A hard mask layer 203 may remain above the second nanowires 210. A buffer layer 202 may be interposed between the second nanowires 210 and the hard mask layer 203.

Figure 7:
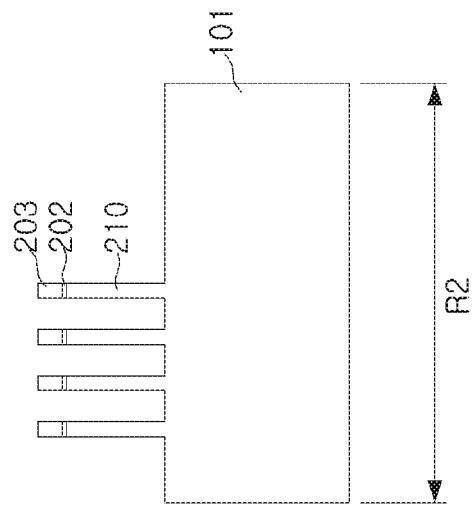
Figure 7:
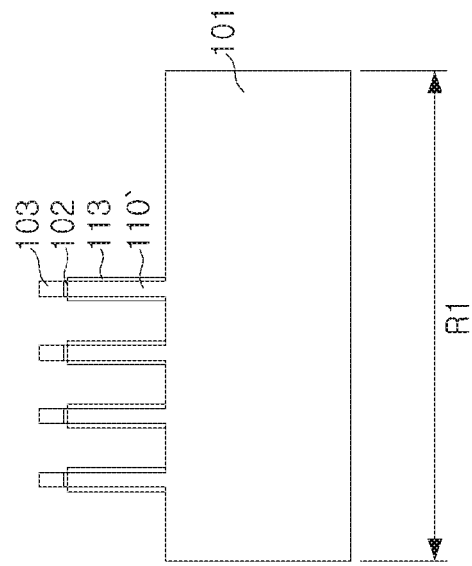

With reference to FIG. 7, a first oxide layer 113 may be selectively formed on a side wall of the first preliminary nanowires 110' on the substrate 101 of the first region R1.

The first oxide layer 113 may be formed using a first oxidation process. The first oxidation process may include a thermal oxidation process, a plasma oxidation process, a radical oxidation process, etc. The first oxide layer 113, formed on an upper surface of the substrate 101 after the first oxidation process, may be removed using an anisotropic etching process.

For example, in order to selectively form the first oxide layer 113 in the first region R1, an oxide layer formed in the second nanowires 210 of the second region R2 and the substrate 101 using the first oxidation process may be selectively removed. Alternatively, in order to selectively form the first oxide layer 113 in the first region R1, an oxidation reduction layer capable of reducing or preventing the second nanowires 210 and the substrate 101 from being oxidized may be formed on the substrate 101 of the second region R2. The oxidation reduction layer may be removed after the first oxide layer 113 is formed.

Figure 8:
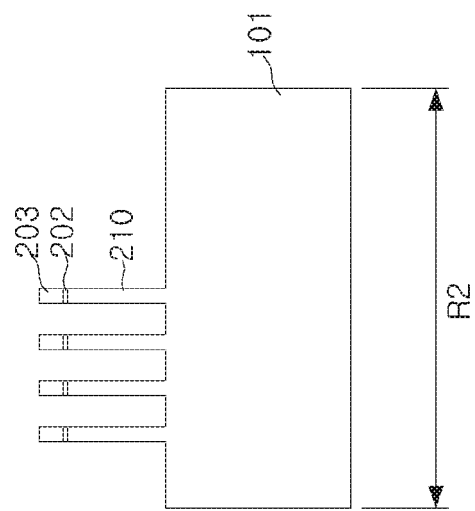
Figure 8:
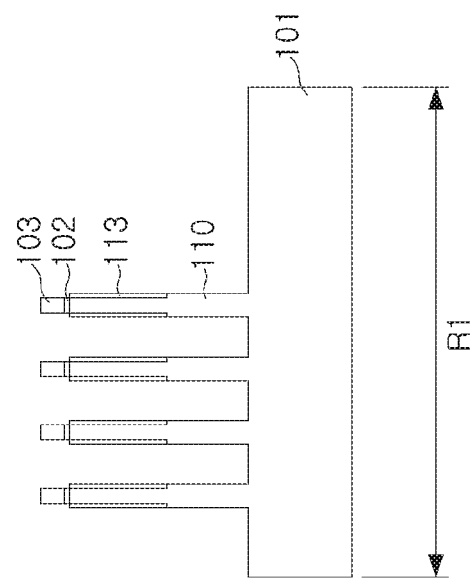

With reference to FIG. 8, the substrate 101 of the first region R1 may be further etched using the first oxide layer 113 as an etching mask, thus forming first nanowires 110.

A height of the first nanowires 110 may be greater than that of the second nanowires 210 based on the upper surface of the substrate 101. Due to an additional etching process, the upper surface of the substrate 101, disposed adjacent to the first nanowires 110 may be disposed to be lower than that of the substrate 101, disposed adjacent to the second nanowires 210.

The first nanowires 110 may include an upper region and a lower region, wider than the upper region. The lower region of the first nanowires 110 may be wider than that of the second nanowires 210.

In order to selectively etch he substrate 101 of the first region R1, an etch stop layer may be formed on the substrate 101 of the second region R2. The etch stop layer may be removed after the first nanowires 110 are formed.

Figure 9:
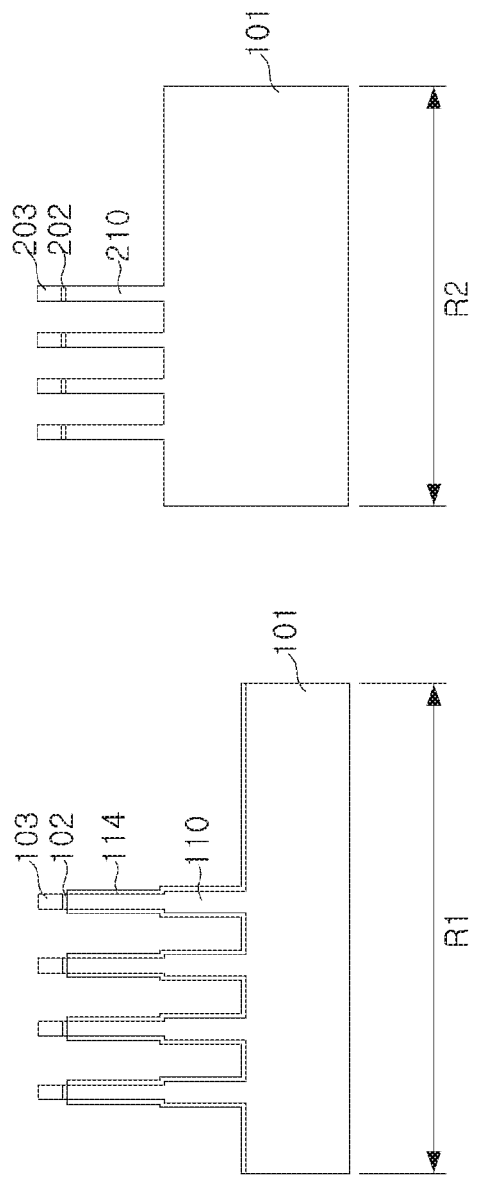

With reference to FIG. 9, a second oxidation process may be performed, thus selectively forming the first dielectric layer 114 in the first region R1.

The second oxidation process may include a thermal oxidation process, a plasma oxidation process, a radical oxidation process, etc.

The second oxidation process may be performed with the first oxide layer 113 remaining in the upper region of the first nanowires 110. A surface of the lower region of the first nanowires 110 and a surface of the substrate 101 may be oxidized by the second oxidation process, thus forming the first dielectric layer 114. During the second oxidation process, a surface of the first nanowires 110 below the first oxide layer 113 may be further oxidized, thus forming the first dielectric layer 114 in the upper region of the first nanowires 110.

In example embodiments, the second oxidation process may be performed after the first oxide layer 113 is removed. The surface of the first nanowires 110 and the surface of the substrate 101 may be oxidized by the second oxidation process, thus forming the first dielectric layer 114.

For example, in order to selectively form the first dielectric layer 114 in the first region R1, an oxide layer formed in the second nanowires 210 of the second region R2 and the substrate 101 by the first oxidation process may be selectively removed. Alternatively, in order to selectively form the first dielectric layer 114 in the first region R1, an oxidation reduction layer capable of reducing or preventing the second nanowires 210 and the substrate 101 from being oxidized may be formed on the substrate 101 of the second region R2. The oxidation reduction layer may be removed after the first dielectric layer 114 is formed.

Figure 10:
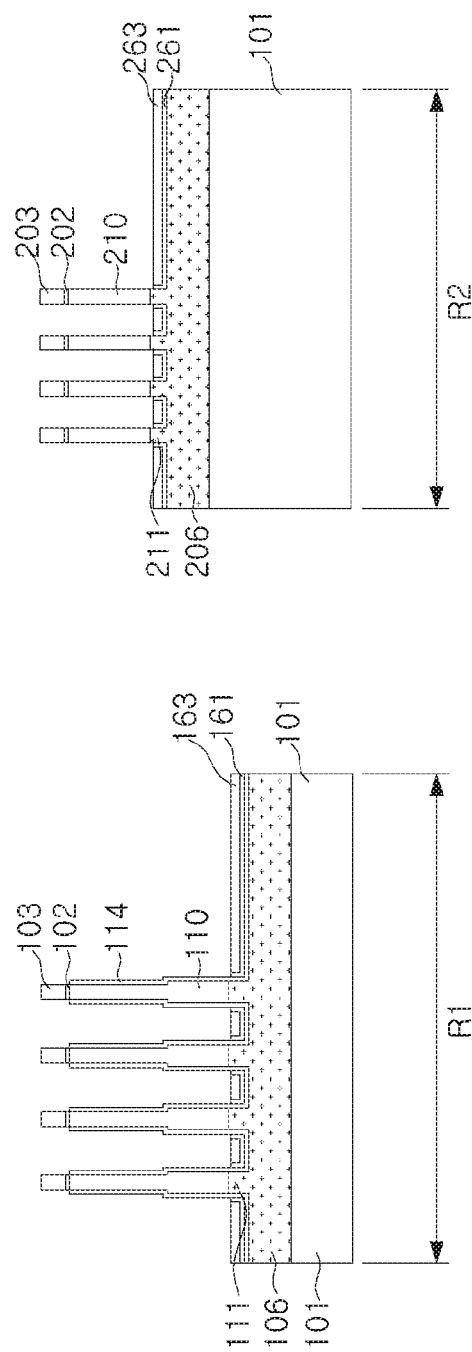

With reference to FIG. 10, a first impurity region 106 and a second impurity region 206 may be formed in the substrate 101, first lower source/drain regions 111 may be formed at bottom portion of the first nanowires 110, and second lower source/drain regions 211 may be formed at bottom portion of the second nanowires 210.

The first impurity region 106, the second impurity region 206, the first lower source/drain regions 111, and the second lower source/drain regions 211 may be formed by ion implantation and diffusion of an impurity. For example, the first impurity region 106, the second impurity region 206, the first lower source/drain regions 111, and the second lower source/drain regions 211 may be provided as a region doped with an n-type impurity. After the process of ion implantation of an impurity, a heat treatment process for activating and diffusing the impurity may be performed. The first impurity region 106 may connect the first lower source/drain regions 111 to each other, while the second impurity region 206 may connect the second lower source/drain regions 211 to each other. An ion implantation process for forming the first lower source/drain regions 111 and the first impurity region 106 and an ion implantation process for forming the second lower source/drain regions 211 and the second impurity region 206 may be performed simultaneously or separately.

Alternatively, the first lower source/drain regions 111 and the second lower source/drain regions 211 may be formed in such a manner that the impurity is diffused from the impurity regions 106 and 206 while subsequent processes are being performed.

First insulating layers 161 and 261 and second insulating layers 163 and 263, covering lower portions of the first nanowires 110 and the second nanowires 210, may be formed on the substrate 101. For example, the first insulating layers 161 and 261 and the second insulating layers 163 and 263, covering the first nanowires 110 and the second nanowires 210, may be formed on the substrate 101, and portions of the second insulating layers 163 and 263 may be removed by an etchback process, in order to provide a desired height. Subsequently, the first insulating layers 161 and 261, exposed in such a manner that the second insulating layers 163 and 263 are removed, may be removed by an isotropic etching process.

The first insulating layers 161 and 261 and the second insulating layers 163 and 263 may play a role in allowing a gate electrode to be subsequently formed to be electrically isolated from the substrate 101. The first insulating layers 161 and 261 and the second insulating layers 163 and 263 may be referred to as a lower spacer.

In example embodiments, the first insulating layers 161 and 261 may not be formed.

Figure 11:
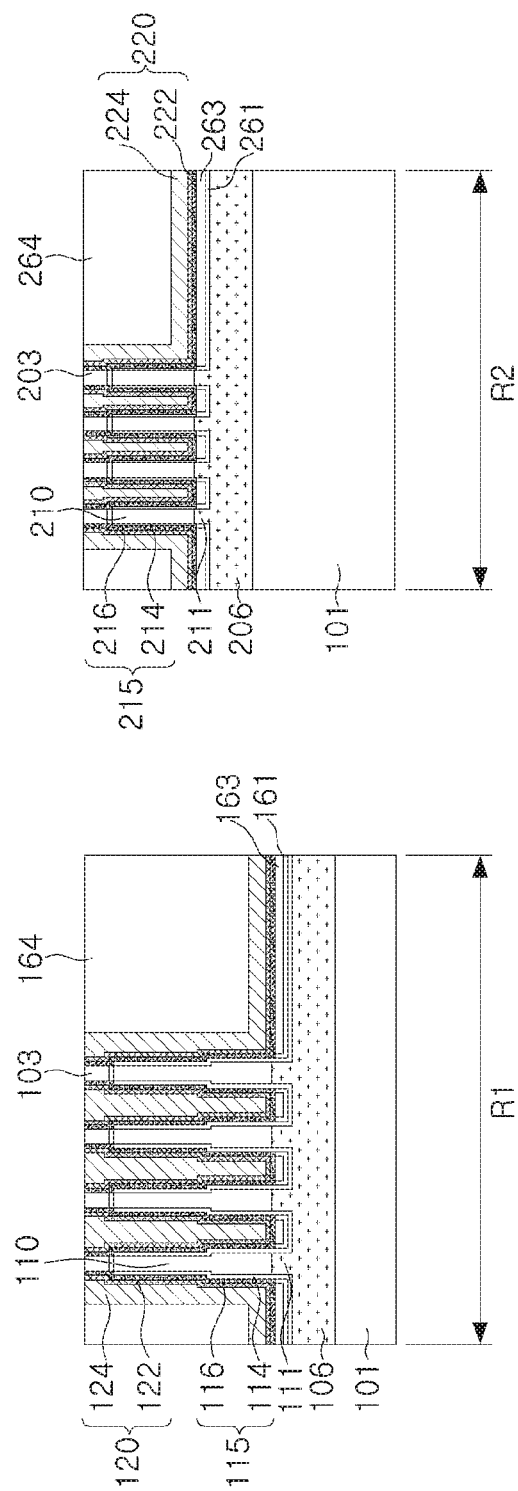

With reference to FIG. 11, a first gate dielectric layer 115 and a first gate electrode 120 may be formed in the first region R1, while a second gate dielectric layer 215 and a second gate electrode 220 may be formed in the second region R2.

A high-k dielectric layer 116 and a high-k dielectric layer 216, covering side surfaces of the first nanowires 110 and the second nanowires 210, may be formed. A second dielectric layer 214 covering the side surfaces of the second nanowires 210 may be formed first, before the high-k dielectric layer 216 covering the side surfaces of the second nanowires 210 is formed, in the second region R2. The second dielectric layer 214 may be formed in such a manner that a separate oxidation process is performed before the high-k dielectric layer 116 and the high-k dielectric layer 216 are formed, or using a process of forming the high-k dielectric layer 116 and the high-k dielectric layer 216.

In the first region R1, the high-k dielectric layer 116 and the first dielectric layer 114 may form a first gate dielectric layer 115. In the second region R2, the high-k dielectric layer 216 and the second dielectric layer 214 may form a second gate dielectric layer 215.

The first gate electrode 120 may include a first conductive layer 122 and a second conductive layer 124, formed thereon, while the second gate electrode 220 may include a first conductive layer 222 and a second conductive layer 224, formed thereon. The first conductive layer 122 and the second conductive layer 124 may form the first gate electrode 120, while the first conductive layer 222 and the second conductive layer 224 may form the second gate electrode 220.

Subsequently, an interlayer insulating layer 164 and an interlayer insulating layer 264 may be formed on the first gate electrode 120 and the second gate electrode 220, and a polishing process may be performed to expose a hard mask layer 103 and a hard mask layer 203.

Figure 12:
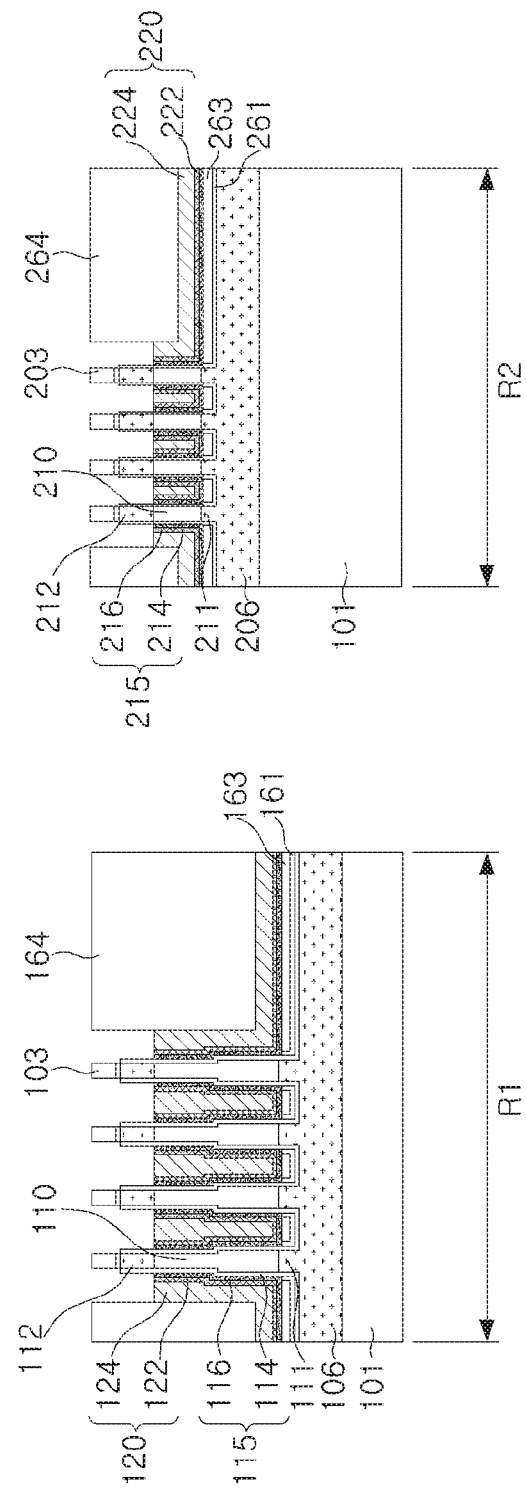

With reference to FIG. 12, a portion of the first gate electrode 120 and a portion of the second gate electrode 220 may be removed, thus adjusting agate length of the first gate electrode 120 and a gate length of the second gate electrode 220. Subsequently, a portion of the high-k dielectric layer 116 and the high-k dielectric layer 216 may also be removed.

The first upper source/drain regions 112 may be formed in a top portion of the first nanowires 110, while the second upper source/drain regions 212 may be formed in a top portion of the second nanowires 210. The first upper source/drain regions 112 and the second upper source/drain regions 212 may be formed using a process of ion implantation of an impurity. The heat treatment process for activating and diffusing the impurity may be performed. Alternatively, the first upper source/drain regions 112 and the second upper source/drain regions 212 may be formed before the process of FIG. 6 is performed. In addition, the first upper source/drain regions 112 and the second upper source/drain regions 212 may be formed after the process of FIG. 13 is performed.

The first gate electrode 120 and the second gate electrode 220 may be removed from an upper surface of the interlayer insulating layer 164 in the same amount. Thus, a distance of a remaining first gate electrode 120 in a vertical direction may be greater than that of a remaining second gate electrode 220 in a vertical direction. In other words, the gate length of the first gate electrode 120 may be greater than that of the second gate electrode 220.

Figure 13:
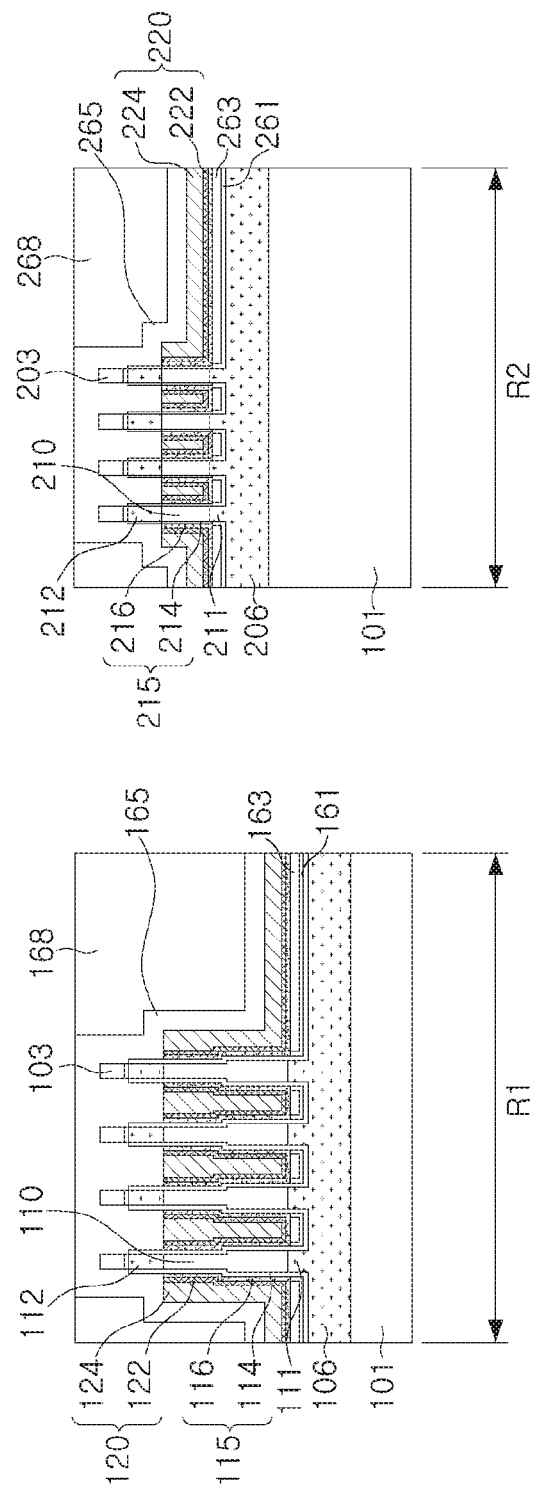

With reference to FIG. 13, a third insulating layer 165, a third insulating layer 265, an interlayer insulating layer 168, and an interlayer insulating layer 268 may be formed on the substrate 101 after the interlayer insulating layer 164 and the interlayer insulating layer 264 are removed.

A process of forming the third insulating layer 165, the third insulating layer 265, the interlayer insulating layer 168, and the interlayer insulating layer 268 may include a deposition process and a polishing process of insulating materials.

With reference to FIGS. 2 and 3, after an interlayer insulating layer 170 and an interlayer insulating layer 270 are formed, the contact plugs 130, 140, 150, 230, 240 and 250 may be formed.

The contact plug 140 may be connected to the first upper source/drain regions 112, while the contact plug 240 may be connected to the second upper source/drain regions 212. The contact plug 150 may be connected to the first gate electrode 120, while the contact plug 250 may be connected to the second gate electrode 220. The contact plug 130 may be connected to the first impurity region 106 of the substrate 101, while the contact plug 230 may be connected to the second impurity region 206 of the substrate 101.

Figure 14:
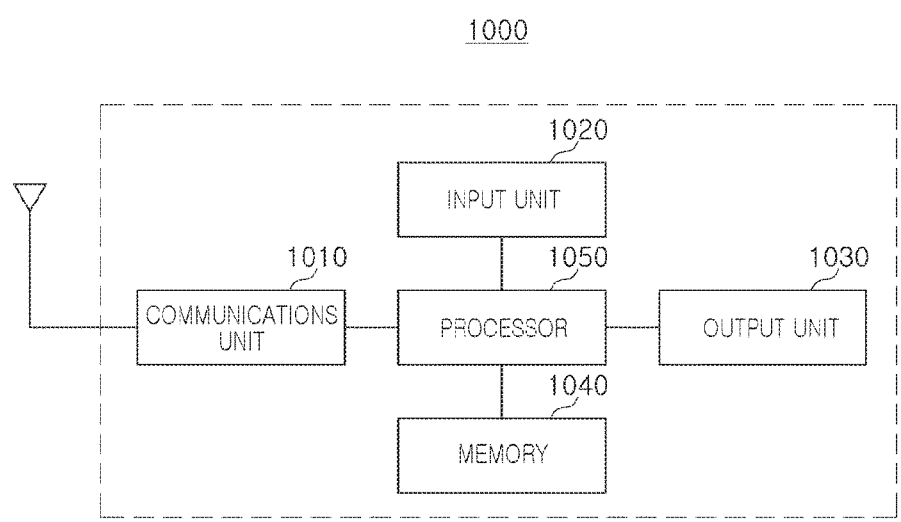
FIG. 14 is a block diagram illustrating an electronic device according to example embodiments of the present inventive concepts.

FIG. 14 is a block diagram illustrating an electronic device according to example embodiments of the present inventive concepts.

With reference to FIG. 14, an electronic device 1000, according to example embodiments, may include a communications unit 1010, an input unit 1020, an output unit 1030, a memory 1040, and a processor 1050.

The communications unit 1010 may include a wired/wireless communications module, for example, a wireless Internet module, a near field communications module, a global positioning system (GPS) module, a mobile communications module, etc. The wired/wireless communications module included in the communications unit 1010 may transmit and receive data by being connected to external communications networks according to various communications standards. The input unit 1020 may be provided as a module provided for users to control operations of the electronic device 1000, and may include a mechanical switch, a touchscreen, a voice recognition module, etc. In addition, the input unit 1020 may also include a finger mouse device or a mouse operated using a trackball, a laser pointer, etc. The input unit 1020 may further include various sensor modules by which users may input data. The output unit 1030 may output information processed in the electronic device 1000 in the form of audio or video, while the memory 1040 may store a program, data, etc., to process and control the processor 1050. The processor 1050 may store as well as output data by sending a command to the memory 1040 according to required operations. The memory 1040 may communicate with the processor 1050 through an interface embedded in the electronic device 1000 or a separate interface. In a case in which the memory 1040 communicates with the processor 1050 through a separate interface, the processor 1050 may store data in or output data from the memory 1040 through various interface standards, may at least partially comprise SD, SDHC, SDXC, MICRO SD, USB, etc. The processor 1050 may control operations of respective units included in the electronic device 1000. The processor 1050 may perform control and process operations relating to voice calls, video calls, data communications, etc., or may perform control and process operations to play and manage multimedia. In addition, the processor 1050 may process inputs sent through the input unit 1020 by a user, and may output the results through the output unit 1030. Furthermore, the processor 1050 may store data required to control operations of the electronic device 1000 in the memory 1040 or output the data therefrom, as described above. At least one of the processor 1050 and the memory 1040 may include semiconductor devices 10 and 10A according to various example embodiments, as described above.

According to example embodiments of the present inventive concepts, a semiconductor device capable of solving a reliability problem including a hot carrier effect of a transistor in an I/O circuit region and having improved performance in such a manner that heights of nanowires in transistors of a logic circuit region and of the input/output circuit region are formed to be different may be provided.

While example embodiments have been shown and described above, it will be apparent to those skilled in the art that modifications and variations could be made without departing from the scope of the present inventive concepts as defined by the appended claims.

What is claimed is:

1. A semiconductor device, comprising:
   a substrate including a first region and a second region;
   at least one first nanowire in the first region in a direction perpendicular to an upper surface of the substrate;
   at least one second nanowire in the second region in the direction perpendicular to the upper surface of the substrate, the second nanowire having a height less than a height of the first nanowire;
   first source/drain regions at a top portion and a bottom portion of the first nanowire;
   second source/drain regions at a top portion and a bottom portion of the second nanowire;
   a first gate electrode surrounding the first nanowire between the first source/drain regions; and
   a second gate electrode surrounding the second nanowire between the second source/drain regions,
   wherein the first nanowire includes an upper region and a lower region wider than the upper region.

2. The semiconductor device of claim 1, wherein the first region is an input/output (I/O) circuit region, and the second region is a logic circuit region.

3. The semiconductor device of claim 1, wherein a gate length of the first gate electrode in a vertical direction is greater than a gate length of the second gate electrode in the vertical direction.

4. The semiconductor device of claim 3, wherein the upper surface of the substrate, adjacent to the first nanowire, is lower in the vertical direction than the upper surface of the substrate, adjacent to the second nanowire.

5. The semiconductor device of claim 4, wherein a difference in heights between the upper surface of the substrate, adjacent to the first nanowire, and the upper surface of the substrate, adjacent to the second nanowire, corresponds to a difference in gate lengths between the first gate electrode and the second gate electrode.

6. The semiconductor device of claim 1, further comprising:
   a first gate dielectric layer between the first gate electrode and the first nanowire; and
   a second gate dielectric layer between the second gate electrode and the second nanowire,
   wherein the first gate dielectric layer is thicker than the second gate dielectric layer.

7. The semiconductor device of claim 6, wherein the first gate dielectric layer comprises a first dielectric layer and a high-k dielectric layer, the second gate dielectric layer comprises a second dielectric layer and a high-k dielectric layer, and the first dielectric layer is thicker than the second dielectric layer.

8. The semiconductor device of claim 1, wherein the first nanowire and the second nanowire have a sheet form in which a width in a first direction is different from a width in a second direction.

9. The semiconductor device of claim 1, further comprising:
   the first nanowire is a plurality of first nanowires and the second nanowire is a plurality of second nanowires,
   wherein the first source/drain regions at bottom portions of the plurality of first nanowires are connected to each other by a first impurity region formed in the substrate, and the second source/drain regions at bottom portions of the plurality of second nanowires are connected to each other by a second impurity region formed in the substrate.

10. A semiconductor device, comprising:
    a substrate;
    a first vertical field-effect transistor including a first nanowire on the substrate and providing a first vertical channel region, a first gate electrode surrounding the first vertical channel region, and a first gate dielectric layer between the first nanowire and the first gate electrode; and
    a second vertical field-effect transistor including a second nanowire on the substrate and providing a second vertical channel region, a second gate electrode surrounding the second nanowire, and a second gate dielectric layer between the second nanowire and the second gate electrode,
    wherein a height of the first nanowire is greater than a height of the second nanowire,
    wherein the first nanowire includes an upper region and a lower region wider than the upper region.

11. The semiconductor device of claim 10, wherein a gate length of the first gate electrode is greater than a gate length of the second gate electrode by a length corresponding to a difference in heights between the first nanowire and the second nanowire.

12. The semiconductor device of claim 10, wherein the first vertical field-effect transistor is in an I/O circuit region, and the second vertical field-effect transistor is in a logic circuit region.

13. The semiconductor device of claim 10, wherein the first nanowire comprises a region having a width wider than a width of the second nanowire.

14. The semiconductor device of claim 10, wherein the first gate dielectric layer is thicker than the second gate dielectric layer.

15. A structure comprising:
- a substrate including a first region and a second region;
- at least one first nanowire in the first region in a direction perpendicular to an upper surface of the substrate;
- at least one second nanowire in the second region in the direction perpendicular to the upper surface of the substrate; and
- an upper end of the second nanowire is closer to the upper surface of the substrate than a upper end of the first nanowire,
- wherein the first nanowire includes an upper region and a lower region wider than the upper region.

16. The structure of claim 15, wherein the first region is an input/output (I/O) circuit region, and the second region is a logic circuit region.

17. The structure of claim 15, wherein the first nanowire and the second nanowire have a sheet form in which a width in a first direction is different from a width in a second direction.

18. The structure of claim 15, further comprising:
- first source/drain regions at a top portion and a bottom portion of the first nanowire;
- second source/drain regions at a top portion and a bottom portion of the second nanowire;
- a first gate electrode surrounding the first nanowire between the first source/drain regions; and
- a second gate electrode surrounding the second nanowire between the second source/drain regions.

* * * * *